United States Patent
Tsai et al.

[11] Patent Number: 6,133,144
[45] Date of Patent: Oct. 17, 2000

[54] SELF ALIGNED DUAL DAMASCENE PROCESS AND STRUCTURE WITH LOW PARASITIC CAPACITANCE

[75] Inventors: Ming-Hsing Tsai, Taipei; Shau-Lin Shue, Hsinchu, both of Taiwan

[73] Assignee: Taiwan Semiconductor Manufacturing Company, Hsin-Chu, Taiwan

[21] Appl. No.: 09/368,864

[22] Filed: Aug. 6, 1999

[51] Int. Cl.[7] ............................................... H01L 21/4763
[52] U.S. Cl. ........................ 438/634; 438/624; 438/618; 438/622; 438/638; 257/758; 257/761; 257/760; 257/776
[58] Field of Search .................................... 438/624, 634, 438/637, 638, 740, 622, 672, 675, 626, 633, 687, 645

[56] References Cited

U.S. PATENT DOCUMENTS

| | | | |
|---|---|---|---|
| 5,635,423 | 6/1997 | Huang et al. | 438/638 |
| 5,753,967 | 5/1998 | Lin | 257/635 |
| 5,795,823 | 8/1998 | Avanzino et al. | 438/639 |
| 5,801,094 | 9/1998 | Yew et al. | 438/624 |
| 5,814,557 | 9/1998 | Venkatraman et al. | 438/622 |
| 5,886,410 | 3/1999 | Chiang et al. | 257/759 |
| 5,920,790 | 7/1999 | Wetzel et al. | 438/618 |
| 5,926,732 | 7/1999 | Matsuura | 438/622 |

*Primary Examiner*—Charles Bowers
*Assistant Examiner*—Hsien-Ming Lee
*Attorney, Agent, or Firm*—George O. Saile; Stephen B. Ackerman

[57] ABSTRACT

An improved and novel process for fabricating unique interconnect conducting lines and via contact structures has been developed. Using this special self aligned dual damascene process, special interconnect conducting lines and via contacts are formed which have low parasitic capacitance (low RC time constants). The invention incorporates the use of double etch stop or etch barrier layers. The key process step of this invention is special patterning of the etch stop or etch barrier layer. This is the advantage of this invention over Prior Art processes that need a continuous, thick stop layer that has a etching selectivity to silicon dioxide, $SiO_2$ (increasing parasitic capacitance). However, in this invention a self aligned dual damascene process and structure is presented that is easier to process and has low parasitic capacitance. Repeating the self aligned dual damascene processing steps, constructs multilevel conducting structures. This process reduces processing time, reduces the cost of ownership, (compatible with low dielectric constant materials) and at the same time produces a product with superior lines and via contact structures (by use of special etch stop or etch barrier layer patterning), hence improving reliability.

44 Claims, 2 Drawing Sheets

SELF ALIGNED DUAL DAMASCENE PROCESS AND STRUCTURE WITH LOW PARASITIC CAPACITANCE

BACKGROUND OF THE INVENTION (1) Field of the Invention

This invention relates to a method of fabrication used for semiconductor integrated circuit devices, and more specifically to the formation of self aligned dual damascene structures are described which lower parasitic capacitance.

As a background to the current invention, the damascene processing is an alternative method for fabricating planar interconnects. Damascene wiring interconnects (and/or studs) are formed by depositing a dielectric layer on a planar surface, patterning it using photolithography and oxide RIE, then filling the recesses with conductive metal. The excess metal is removed by chemical mechanical polishing (CMP), while the troughs or channels remain filled with metal. For example, damascene wiring lines can be used to form bit lines in DRAM devices, with processing similar to the formation of W studs in the logic and DRAM devices. In both examples, sputtered Ti/TiN liners have been coated with chemical vapor deposited (CVD) W metal, then polished back to oxide.

The damascene approach has been adopted in many applications, since it efficiently provides the high yield and large process windows required for volume manufacturing. The use of CMP leads to a decrease in the number of interlevel shorts and lowers defect densities, since unwanted surface material is easily removed. Upon completion of CMP, the wafer surface is returned in a globally planar state, extending process windows for subsequent process steps, i.e., lithographic, etching, and CMP processing steps.

Key to the damascene processing approach is that the deposited conductive metal is deposited into a previously deposited patterned insulator. This is desirable because mask alignment, dimensional control, rework, and the etching process are all easier when applied to a dielectric rather than metal films. Damascene processing achieves these benefits by shifting the enhanced filling and planarization requirements from dielectric to metal films, and by shifting control over interconnect thickness from metal deposition to insulator patterning and metal CMP.

Sputter deposition has some key advantages as a metal deposition technique because it can be used to deposit many conductive materials, at high deposition rates, with good uniformity and low cost of ownership. Conventional sputtering does not fill or coat recessed features well. Sputtered atoms are typically ejected from a target in all directions, though the degree of flux directionality depends on the specific material being deposited, and on deposition conditions. Conventional sputtering fill is poorer for deeper, narrower (high-aspect-ratio) features. In addition, fill is especially bad for corners of recesses, which have relatively small acceptance angles for flux, and for thick depositions, since the upper surface deposition can block incoming flux and produce a void in the recessed feature.

The fill factor by sputter deposition has been significantly improved by collimating the sputtered flux. A collimated flux is produced by removing sputtered flux that approaches the substrate at a large angle from the surface normal. Typically, this is achieved by inserting between the target and substrate a collimator plate having an array of hexagonal cells.

Collimated sputtering is acceptable for thin liner depositions to cover features having moderate aspect ratios, but is not an appropriate technique for the complete filling of such features. Instead, for short-distance wiring such as studs and bit lines for which the high conductivity of Al is not required, chemical-vapor-deposited (CVD) W has proven to be a robust process that integrates easily with liner deposition and CMP to provide a manufacturing interconnect module. In addition, the W is easily patterned using CMP since it is hard and corrosion-resistant. It is also compatible with RIE formation of overlying Al-based wires, since it offers excellent etch selectivity in the preferred Cl-based chemistries.

Chemical vapor deposition (CVD) of W usually requires an underlying conductive barrier and "seed" layers to prevent consumption of substrate Si from reaction with $WF_6$ at the contact level, and to promote distributed nucleation and low contact resistance. A layer of Ti is used since it provides good adhesion and low contact resistance. However, the Ti alone is not sufficient, because the F from the $WF_6$ reacts with the Ti and produces a brittle, high-resistivity compound. However, the use of a TiN film between the Ti and W solves these problems by enhancing W nucleation while preventing the reaction of F with the Ti or any exposed Si. A W seed layer is then formed on the TiN.

Since Ti-based liners are less conductive and less easily polished than W, it is desirable to keep the liners as thin as possible. However, since the sputtered (PVD) liners are not conformal, inadequate coverage of recesses or foreign material defects can allow F to react with the underlying Ti, causing the liners to detach from their substrate. The TiN layer can crack and curl up, since the film is in tension. The CVD W can then deposit on the rolled-up TiN and these formations are termed tungsten "mounds" or "mushrooms". Improvements in commercial process equipment have improved the CVD liners, for example, the CVD TiN and Ti processes. Furthermore, CVD Ti and TiN offer good conformality, but require higher deposition temperatures and contain higher levels of impurities than do the sputtered (PVD) films.

After deposition, CMP is applied to complete the inlaid structure. In the CMP process, material is removed from the wafer through the combined effects of a polish pad and an abrasive slurry. The chemical dissolution of material is aided by a mechanical component which is useful in removing passivating surface layers. Chemical and mechanical selectivity's between materials are desired, since CMP must remove the metal overburden without removing appreciable amounts of inlaid metal or reducing interconnect thickness.

Scratching of the polished surface must also be avoided. Scratches in the inlaid metal can reduce the cross section locally, resulting in an elevated current density and/or elevated stress, thereby accelerating interconnect failures.

In the dual-damascene process, a monolithic stud/wire structure is formed from the repeated patterning of a single thick oxide film followed by metal filling and CMP. First, a relatively thick oxide layer is deposited on a planar surface. The oxide thickness is slightly larger than the desired final thickness of the stud and wire, since a small amount of oxide is removed during CMP. Stud recesses are formed in the oxide using photolithography and RIE that either partially etches through the oxide or traverses the oxide and stops on the underlying metal to be contacted. The wire recesses can then be formed using a separate photolithography step and a timed oxide etching step. If the former stud RIE option is used, the wire etching completes the drilling of the stud holes.

Alternatively, the wire recesses can be formed first, but this approach makes the photolithography for the studs more difficult, since the resulting surface is less planar. Next, the stud/wire metallization is deposited, then planarized using CMP. The resulting interconnects are produced with fewer process steps than with conventional processing and with the dual damascene process, two layer of metal are formed as one, i.e., wiring line and contact stud vias, avoiding an interface between the layers.

The dual-damascene process can be more difficult to fill and planarization than the single-damascene processing. Specifically, the metal films must now fill features having aspect ratios much greater than 1. This can be attained with CVD W, provided the adhesive liner covers the recessed surfaces. To obtain adequate liner coverage using collimated sputtered (PVD) Ti/TiN liners, a larger liner thickness must be applied, which is then difficult to polish away, without dishing (W dishing due to its easy removal by CMP). Furthermore, the conformal filling afforded by CVD W results in local recesses over the high-aspect-ratio dual-damascene features that contribute to dishing during polishing.

It is a general object of the present invention to provide a novel and improved method for using a self aligned dual damascene process for fabricating self aligned dual damascene structures which have low parasitic capacitance (lowering RC time constant).

(2) Description of Related Art

The present invention is a new and improved method for using a self aligned dual damascene process which produces special structures with low parasitic capacitance for quarter micron and below semiconductor devices. Related Prior Art background patents will now be described in this section.

U.S. Pat. No. 5,814,557 entitled "Method of Forming an Interconnect Structure" granted Sep. 29, 1998 to Venkatraman et al describes a method for forming copper dual damascene structures. An interconnect structure is formed by filling a dual damascene structure with conductive material. A barrier layer is formed to serve as a seed layer and to prevent the out diffusion of copper. A first conductive layer is formed to fill a first portion of the damascene structure. A second conductive layer is then formed to complete the filling of a second portion of the damascene structure. A chemical mechanical polishing (CMP) process is then used to remove any excess conducting material.

U.S. Pat. No. 5,801,094 entitled "Dual Damascene Process" granted Sep. 1, 1998 to Yew et al. describes a dual damascene method of forming a two level metal interconnect structure by first providing an interlevel oxide over a device structure and covering the interlevel oxide layer with an etch stop layer. The etch stop layer is patterned to form openings corresponding to the pattern of the interconnects that are to be formed in the first level of the two level interconnect structure. After the etch stop layer is patterned, an intermetal oxide layer, interlevel dielectric (ILD), is provided over the etch stop layer. A photoresist mask is then provided over the interlevel dielectric (ILD) with openings in the mask exposing portions of the ILD layer in the pattern of the wiring lines to be provided in the second level of the interconnect structure. The ILD layer is etched and the etching process continues to form openings in the ILD layer where the ILD is exposed by openings in the etch stop layer. Therefore, with a single etch step, the openings for both the second level wiring lines and the first level interconnects are defined. The dual damascene process forms holes (vias and contacts) and wiring lines (interconnect lines) simultaneously. Metal is then deposited over the structures and excess metal is removed by chemical mechanical polishing (CMP) to define the two level wiring and interconnect structure.

U.S. Pat. No. 5,795,823 entitled "Self Aligned Via Dual Damascene" granted Aug. 18, 1998 to Avanzino et al describes a method of a self-aligned dual damascene process. A method of fabricating an interconnection level of conductive lines and connecting vias separated by insulation for integrated circuits and substrate carriers for semiconductor devices using dual damascene with only one mask pattern for the formation of both the conductive lines and vias. The mask pattern of conductive lines contains laterally enlarged areas where the via openings are to formed in the insulating material. After the conductive line openings with laterally enlarged areas are created, the openings are filled with a conformal material whose etch selectivity is substantially less than the etch selectivity of the insulating material to the enchant for etching the insulating material and whose etch selectivity is substantially greater than the insulating material to its enchant. The conformal material is anisotropically etched to form sidewalls in the enlarged area and remove the material between the sidewalls but leave material remaining in the parts of the conductive lines openings. The sidewalls serve as "self aligned mask" for etching via openings. The conformal material is either a conductive material which is left in place after the via openings are formed or an insulating material which is removed. The partially filled conductive line openings are filled with additional conductive material along with the via, which is either the same or different conductive material. The conductive line openings and vias are filled with the same conductive material.

U.S. Pat. No. 5,753,967 entitled "Damascene Process for Reduced Feature Size" granted May 19, 1998 to Lin describes a method for a dual damascene process. Submicron contacts/vias and trenches are provided in a dielectric layer by forming an opening having an initial dimension and reducing the initial dimension by depositing a second dielectric material in the opening. An object of the invention is describes as an integrated semiconductor device containing an interconnection structure of planarized layers having minimal interwiring spacing. Also described is an improved damascene method for forming an interconnection structure having a conductive pattern wherein the conductive lines and/or interwiring spacing is less 0.35 microns. The objects are described as a semiconductor device comprising: a first dielectric layer, comprising a first dielectric material, having an upper surface, a lower surface, and a first opening extending through the first dielectric layer from the upper surface to the lower surface, wherein the first opening has a first dimension defined by a first sidewall having a finite thickness comprising a second dielectric material.

U.S. Pat. No. 5,635,423 entitled "Simplified Dual Damascene Process For Multi-Level Metallization and Interconnection Structure" granted Jun. 3, 1997 to Huang et al describes a method for a dual damascene processes. A semiconductor device containing an interconnection structure having a reduced interwiring spacing is produced by a "modified" dual damascene process. An opening for a via is initially formed in a second insulative layer above a first insulative layer with an etch stop layer in between. A larger opening for a trench is then formed in the second insulative layer while simultaneously extending the via opening through the etch stop layer and first insulative layer. The trench and via are then simultaneously filled with conductive material.

The present invention is directed to a novel and improved method of fabrication an integrated circuit, in which a self aligned dual damascene process and structure are formed, easing processing and lowering parasitic capacitance. The method of the present invention requires less processing time, has lower cost than conventional dual damascene methods and produces self aligned dual damascene interconnect line and vias structures with low parasitic capacitance.

SUMMARY OF THE INVENTION

It is a general object of the present invention to provide an improved method of forming an integrated circuit in which a self aligned dual damascene process and structure are described which lowers parasitic capacitance. Several methods have been proposed for forming dual damascene structures. All these processes need a stop layer that has a etching selectivity to silicon dioxide, $SiO_2$. Increasing the thickness of the stop layer would be easier to process. However, a thicker stop layer will increase the parasitic capacitance. In addition, by using a thinner stop layer (decreases parasitic capacitance), the profiles of the trench and via structures are made more difficult to control. However, in this invention a self aligned dual damascene process and structure is presented that is easier to process and has low parasitic capacitance.

Provided by Prior Art methods is a semiconductor silicon substrate with the first level of metal copper wiring being defined, embedded in a first layer of insulator, silicon oxide $SiO_x$. The invention starts with these conventional layers being provided. Also provided by Prior Art methods, can be a metal diffusion barrier and metal "seed" layer beneath the metal copper wiring layers. The barrier layer acts as metal diffusion barrier and the seed layer can be used to preferentially pattern and initiate metal film growth (e.g., in plating processes). These said thin film layers or layer can also aid in adhesion for the metal wiring above. In addition, the first level metal is placed on an interlevel dielectric (ILD) insulating layer (an interconnect line layer, or device contact region to P-N junctions), provided by Prior Art methods.

In accordance with the present invention, the above and other objectives are realized by using a method of fabricating self aligned dual damascene structures which lower parasitic capacitance. In accordance with the first embodiment of the present invention, the first etch stop layer is deposited over the first level wiring layer and the insulating layer provided above. This first etch stop layer consists of a refractory insulating material or materials with selective etch properties. Silicon nitride, $Si_3N_4$ or $Si_xN_y$, and/or silicon oxynitride, $Si_xON_y$, are utilized for the first etch stop layer and are blanket deposited by plasma enhanced chemical vapor deposition (PECVD).

The first intermetal dielectric layer (IMD) is blanket deposited over the first etch stop layer. This first IMD layer is also a refractory insulating material or materials with selective etch properties compared to the etch stop layer. Silicon oxide, $SiO_x$, is utilized for this first intermetal dielectric layer (IMD) and is blanket deposited by plasma enhanced chemical vapor deposition (PECVD).

In a second embodiment of the present invention, the above and other objectives are realized by using a method of fabricating self aligned dual damascene structures which lower parasitic capacitance. In accordance with the second embodiment of the present invention, next in the process is the blanket deposition of the second etch stop layer. This second etch stop blanket layer is patterned subsequently in a special way (as described further on), and therefore, this layer can be refractory insulating material or even conducting metal material (due to the subsequent pattern formed). The second etch stop layer material, e.g., can be: tantalum nitride TaN, titanium nitride TiN, metal and must have different or selective etch properties from the subsequent second layer of the intermetal dielectric (IMD), which is silicon oxide $SiO_x$. Materials, such as, TaN and/or TiN, which can be utilized for the second etch stop layer are blanket deposited by plasma enhanced chemical vapor deposition (PECVD).

In the main key embodiment of this invention, the third embodiment, a special patterning process is employed to fabricate special self aligned dual damascene structures that have low parasitic capacitance. This key process step in this invention is the special patterning performed to the second etch stop layer. Note the special patterns formed, by conventional methods, for the subsequent via structure and the subsequent interconnect trench or channel. The "unused" stop layer material is removed over the via (leaving small side structures) and patterned, in such a way, as to leave the stop layer material in trench areas. The patterning and etching the second etch stop layer, for process control, stops on the first IMD layer, silicon oxide.

And in yet a fourth embodiment of the present invention, the above and other objectives are realized by using a method of fabricating self aligned dual damascene structures with low parasitic capacitance, wherein a second IMD, intermetal dielectric layer is blanket deposited over the specially patterned, second etch stop structures. Photolithography patterning with photoresist for both via pattern (combination via and trench) and trench pattern are performed.

In yet another key embodiment of this invention, the levels of intermetal dielectric (IMD) and etch stop layers are removed by partially self-aligned and highly selective reactive ion etch (RIE) processing to fabricate both: (i) via and interconnect (trench/channel) structures, and (ii) interconnect (trench/channel) structures.

Another object of the present invention is to provide an improved method of processing self aligned dual damascene structures, wherein both the blanket first etch stop layer and the specially patterned second etch stop layer, are utilized to advantage and can be composed of different materials, for second etch processing step of this invention. Therefore, for via and interconnect formation: etching (the second etch processing step) past the guided photoresist patterned (open) areas, down through the second IMD layer $SiO_x$, etching down through the edges of the partially aligned patterned second etch stop ($Si_xN_y$,TaN,TiN) layer, down through the first IMD ($SiO_x$) layer, down through the the first etch stop ($Si_xN_y$/SiON) layer (in yet a third etch processing step), finally connecting through to the first layer wiring. Whilst for interconnect (trench or channel) formation: etching (the second etch processing step) past the guided photoresist patterned (open) areas, down through the second IMD layer $SiO_x$, finally etching down through the aligned and patterned second etch stop ($Si_xN_y$,TaN,TiN) (in yet a the third etch processing step).

As the stated above, a third etch processing step can be utilized to advantage by changing etch chemistry to include this third etch process step, which selectively moves any remaining etch stop layers. This final etch process is utilized to simultaneously remove the second stop layer and first etch stop in the interconnect (trench/channel), in one final etch step. These said layers, the first etch stop layer and the second etch stop layer can be the same material, e.g., silicon nitride or silicon oxynitride of approximately the same thickness. Said etch stop layers can be removed by a third etch step using a selective reactive ion etch (RIE) process.

And in yet another embodiment of the present invention, the above and other objectives are realized by using a method of fabricating a self aligned dual damascene structure with low parasitic capacitance on a semiconductor substrate, wherein special low parasitic capacitance structures are fabricated at the edges of the interconnect/via structure and at the edges of the interconnect structure. These special (low parasitic capacitance) edge structures are partially patterned and etched remnants, left over from the second etch stop layer material. The small said edge structures lower the overall parasitic capacitance (lower the RC time constant), compared to conventional processing. Conventional dual damascene processing may leave in place a high dielectric constant material, forming a continuous thick layer, which then causes high parasitic capacitance. Furthermore, as was stated above, with conventional processing the thicker the continuous remnant etch stop layer, then the higher the parasitic capacitance (increases the RC time constant of the signals). Note, that just prior to the deposition of the conductive metal wiring layer, there can be can be a metal diffusion barrier layer and/or metal "seed" layer beneath the metal copper wiring layers. The metal diffusion barrier layer and possible metal seed are film layers which may also aid in metal adhesion, conducting metal fill factor (in high aspect ratio trench and vias) and in conducting metal patterning. Finally, conducting metal is deposited by chemical vapor and followed by a special chemical mechanical (CMP) process to remove excess copper metal, that produces dual damascene interconnect and via structures without dishing effects.

It is a general object of the present invention to provide an improved method of forming an integrated circuit in which a self aligned dual damascene process and structure as described above which lowers parasitic capacitance. Applications of this invention can be extended to low dielectric materials for etch stop layers and for intermetal dielectric (IMD) layers.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

It is a general object of the present invention to provide a new and improved method of forming an integrated circuit in which a special self aligned dual damascene process and structure are described which the lowers parasitic capacitance of the interconnect wiring.

Figure 1:
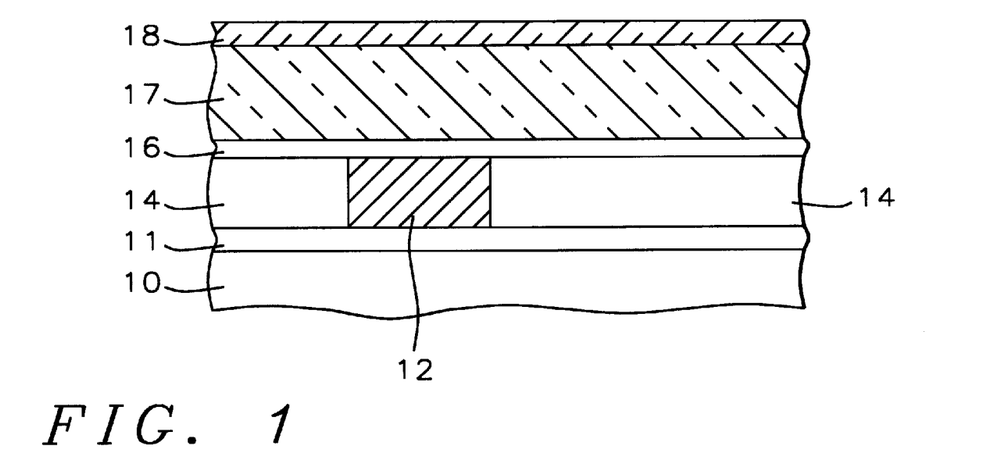
FIG. 1, which in cross-sectional representation illustrates the initial starting point for the self aligned dual damascene process, which is depositing an etch stop or etch barrier layer over the first IMD, intermetal dielectric, layer.

Referring to FIG. 1, which in cross-sectional representation, shows a semiconductor silicon substrate 10 with the first level of metal copper wiring 12 being defined, embedded in the first layer of insulator 14, silicon oxide $SiO_x$. The invention starts with these conventional layers being provided by Prior Art methods. Also provided by Prior Art methods, can be a metal "seed layer" and metal diffusion barrier layer beneath the metal copper wiring layers 12. (These seed and barrier layers are thin film adhesion layers or layer, not shown in the Figs.). In addition, the first level metal 12 is placed on an interlevel dielectric (ILD) insulating layer 11 (an interconnect line layer, or device contact region to P-N junctions), provided by Prior Art methods.

Referring to again to FIG. 1, the first etch stop layer 16 is deposited over the first level wiring layer 12 and the insulating layer 14. This first etch stop layer is a refractory insulating material or materials with selective etch properties. Silicon nitride, $Si_3N_4$ or $Si_xN_y$, and/or silicon oxynitride, $Si_xON_y$, are utilized for the first etch stop layer 16 and are blanket deposited by plasma enhanced chemical vapor deposition (PECVD) in a thickness range from about 100 to 1,000 Angstroms.

Referring again to FIG. 1, the first intermetal dielectric layer (IMD) 17 is blanket deposited over the first etch stop layer 16. This first IMD layer is also a refractory insulating material or materials with selective etch properties compared to the etch stop layer 16. Silicon oxide, $SiO_x$, is utilized for this first intermetal dielectric layer (IMD) 17 and is blanket deposited by plasma enhanced chemical vapor deposition (PECVD) in a thickness range from about 1,000 to 20,000 Angstroms.

Referring again to FIG. 1, next in the process is the blanket deposition of the second etch stop layer 18, as depicted in FIG. 1. This second etch stop blanket layer is patterned subsequently in a special way (see FIG. 2), and therefore, this layer can be refractory insulating material or even conducting metal material (due to the subsequent pattern formed). Second etch stop layer 18 material, e.g., can be: tantalum nitride TaN, titanium nitride TiN, metal and must have different or selective etch properties from the subsequent second layer of the intermetal dielectric (IMD), which is silicon oxide $SiO_x$. Materials, such as, TaN and/or TiN, are utilized for the second etch stop layer 18 are blanket deposited by physical vapor deposition (PVD), reactive sputtering, in a thickness range from about 30 to 500 Angstroms.

Figure 2:
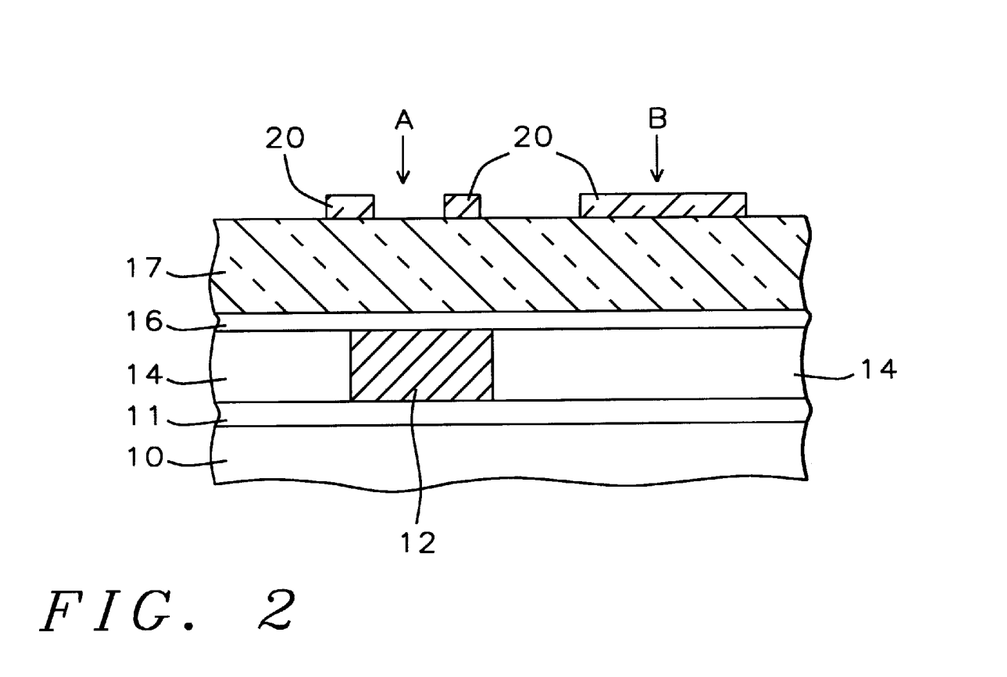
FIG. 2, which in cross-sectional representation illustrates the invention's key processing step for the self aligned dual damascene process and structures, which is the special patterning of the etch stop or etch barrier layer over the first IMD, intermetal dielectric layer.

Referring to FIG. 2, this sketches in cross-section, the main embodiment of this invention. This shows the key process and structure step in this invention, which is the special patterning performed to the second etch stop layer 20. is patterned. Note the special patterns formed for the subsequent via structure (shown by arrows as region A in FIG. 2) and the subsequent interconnect trench or channel (shown by arrow as region B in FIG. 2). The "unused" stop layer material is removed over the via (A, with small side structures) and patterned, in such a way, as to leave the stop layer material (B) in trench areas. The patterning and etching the second etch stop layer 20, for process control, stops on the first IMD layer 17, silicon oxide. For completeness in FIG. 2, all other layers remain the same: silicon substrate 10, interlevel dielectric (ILD) 11 (an interconnect line layer, or device contact region to P-N junctions), first level metal 12, first level insulator 14, first etch stop 16, first intermetal dielectric (IMD) 17, second etch stop 20 (specially patterned) with subsequent via region A and interconnect region B (see arrows).

Figure 3:
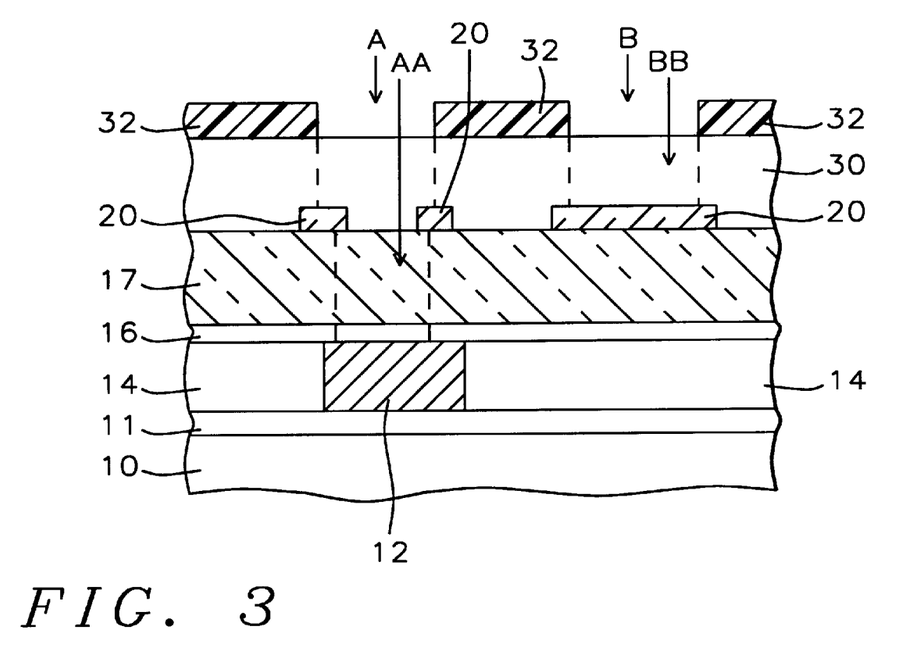
FIG. 3, which in cross-sectional representation illustrates a patterning and etch step for the self aligned dual damascene process, which forms the trench/via openings and trench or channel openings.

Referring to FIG. 3, in cross-sectional representation the second IMD, intermetal dielectric layer 30 is blanket deposited over the specially patterned, second etch stop structures, layer 20. Photolithography patterning with photoresist 32 for both via pattern AA (combination via and trench) and trench pattern BB are performed, as depicted in FIG. 3. (For completeness, all the others remain the same, that is, in FIG. 3: silicon substrate 10, interlevel dielectric (ILD) 11 (an interconnect line layer, or device contact region to P-N junctions), first level metal 12, first level insulator 14, first etch stop 16, first intermetal dielectric (IMD) 17, second etch stop 20 (specially patterned) with via region A and interconnect region B, see arrows and dotted lines.)

Referring again to FIG. 3, in cross-sectional representation and the dotted lines and arrows represent the regions or areas exposed to and removed by reactive ion etching (RIE). In yet another key embodiment of this invention, levels IMD intermetal dielectric and etch stop layers are removed by partially self-aligned and highly selective etch processing in regions AA, dotted lines and arrows, and regions BB, dotted lines and arrows, to fabricate via and interconnect (trench/channel) structures and interconnect (trench/channel) structures.

Referring again to FIG. 3, note that both the blanket first etch stop layer 16 and the specially patterned second etch stop layer 20, are utilized to advantage, and can be composed of different materials, for second etch processing step of this invention. Therefore, for via and interconnect formation (see AA and dotted lines): etching (the second etch processing step) past the guided photoresist patterned (open) areas, down through the second IMD layer 30 $SiO_x$, etching down through the edges of the partially aligned patterned second etch stop ($Si_xN_y$, TaN, TiN) layer 20, down through the first IMD ($SiO_x$) layer 17, down through the the first etch stop ($Si_xN_y$/SiON) layer 16 (in the third etch processing step), finally connecting thru to the first layer wiring 12. Whilst for interconnect (trench or channel) formation (see BB and dotted lines): etching (second etch processing step) past the guided photoresist patterned (open) areas, down through the second IMD layer 30 $SiO_x$, finally etching down through the aligned and patterned second etch stop ($Si_xN_y$, TaN, TiN) layer 20 (in the third etch processing step).

Referring again to FIG. 3, as the invention teaches, etch chemistries can be changed and another etch processing step can be included (a third etch process step) to remove selectively any remaining etch stop layers. This final etch process is utilized to simultaneously remove the second stop layer and first etch stop in the interconnect (trench/channel) in one final etch step. These said layers, the first etch stop layer and the second etch stop layer, are approximately from 50 to 500 Angstroms thick and can be the same material, e.g., silicon nitride or silicon oxynitride. Said etch stop layers are removed by reactive ion etch (RIE) using a separate selective etch step with different etch chemistry after via/trench etch formation. The etch selectively of said etch stop layers with $SiO_x$ is about 20 to 1.

Figure 4:
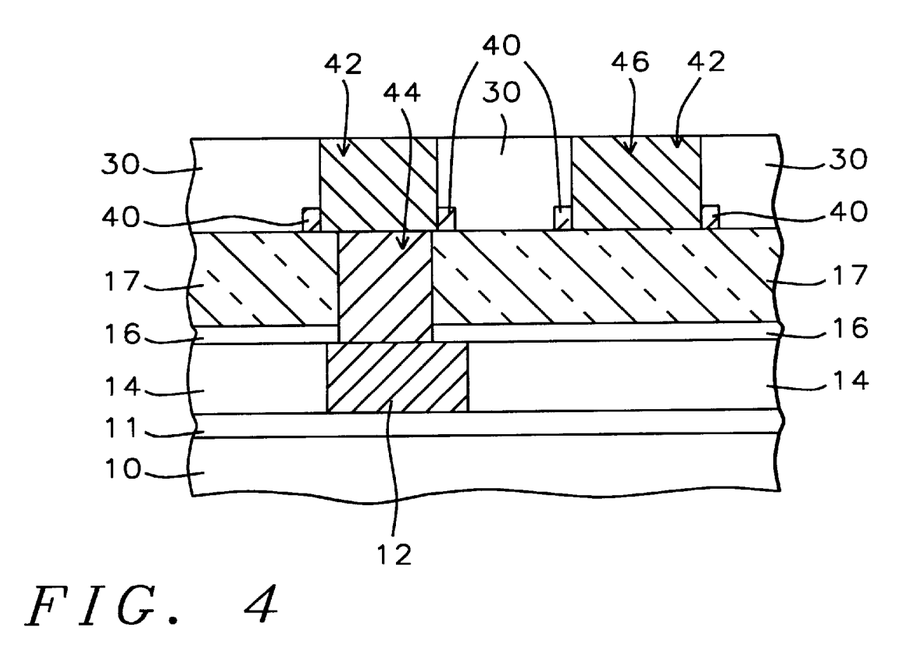
FIG. 4, which in cross-sectional representation illustrates the metal fill and planarization of excess metal, for the special self aligned dual damascene structures, forming interconnect/via and interconnect wiring structures. These wiring structures have special low dielectric constant edge structures on sides of the interconnect lines that lower parasitic capacitance (lower RC time constants).

Referring to FIG. 4, cross-sectional sketch, note the structures formed (40) at the edges of the interconnect/via structure (44) and at the edges of the interconnect (46). These edge structures 40 are composed of the partially patterned and etched remnants left over from the second stop layer. The small said edge structures 40 lower the overall parasitic capacitance (lower the RC time constant) compared to conventional processing, whereby an insulating high dielectric constant continuous etch stop layer may be left in place. Furthermore, with conventional processing the thicker the continuous remnant etch stop layer the higher the parasitic capacitance which increases the RC time constant of the signals. Prior to the deposition of the conductive metal wiring layer 42, there can be can be a metal "seed layer" and metal diffusion barrier layer beneath the metal copper wiring layers 42. (The seed and barrier layers are thin film layers or layer, which aid adhesion and are not shown in the Figs.). Next copper metal is deposition by chemical vapor deposition (CVD) or by electrochemical deposition (ECD), electrode-less copper deposition (ECD), followed by chemical mechanical polish (CMP) of the excess metal without dishing effects. Good fill factors are obtained for metal depositions filling trenches and vias with aspect ratios ranging from about 3.5 to 10. (Again for completeness, all the others remain the same, that is, in FIG. 4: silicon substrate 10, interlevel dielectric (ILD) 11 (an interconnect line layer, or device contact region to P-N junctions), first level metal 12, first level insulator 14, first etch stop 16, and first intermetal dielectric (IMD) 17.)

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit on a substrate, the method comprising:

providing a substrate or substrate module;

providing a substrate having a layer dielectric, interlevel dielectric (ILD), or an interconnect line layer, or device contact region to P-N junctions;

providing a first level of conducting wiring being defined and embedded in a first layer of insulator, depositing (blanket) of a first etch stop barrier;

depositing (blanket) of the first intermetal dielectric layer (IMD) over first etch stop barrier;

depositing (blanket) of a second etch stop barrier layer over the first intermetal dielectric layer;

patterning and etching said second etch stop barrier by a partial removal of the second etch stop barrier over via and leaving the second etch stop barrier for trench or channel;

depositing (blanket) of a second intermetal dielectric layer (IMD) over the patterned etch barrier;

patterning and etching forming special interconnect/via structures and interconnect structures;

etching selectively to remove remnant etch stops;

depositing channel and via barrier liner material, in addition to conducting material, and polishing back by chemical mechanical polishing (CMP) the excess;

repeating the above process steps to construct multilevel conducting layers by this integrated method.

2. The method of claim 1, wherein said substrate is semiconductor single crystal silicon.

3. The method of claim 1, wherein said layers of etch stop barriers are low dielectric films, comprising of refractory materials selected from the group consisting of silicon nitride and silicon oxynitride with very different etch properties than silicon oxide for selective etching and act as etch stop barriers.

4. The method of claim 1, wherein special self aligned patterning and etch of the subsequent interconnect/via hole and interconnect (trench/channel) is performed which produces well-defined, special low parasitic capacitance structures (with low RC time constants).

5. The method of claim 1, wherein highly selective etch steps are performed using both the large etch differences between silicon oxide and silicon nitride and the specially patterned structures of the double level etch barrier stop layers.

6. The method of claim 1, wherein the combination interconnect/via structure and interconnect structures are unique, special, self aligned, with low parasitic capacitance, formed by special patterning and selective etch steps.

7. The method of claim 1, wherein both interconnect/via structures and interconnect structures are robustly fabricated with small, remnant low dielectric (etch stop barrier material) edge features at base of said structures which allow for low parasitic capacitance (low RC time constant).

8. The method of claim 1, wherein the highly selective patterned etches comprise the following etch stop layers: first etch stop layer plasmas enhanced chemical vapor deposited from about 100 to 1,000 Angstroms thick of silicon nitride and/or silicon oxynitride, second etch stop layer reactive sputter deposited from about 30 to 500 Angstroms thick of TaN and/or TiN with intermetal dielectric layers of silicon oxide plasma enhanced CVD with 1,000 to 20,000 Angstroms thick.

9. The method of claim 1, wherein the highly selective patterned etches comprise critical process controls for all etch steps, with the use of fine tuning the etch selectivity and the use of endpoint signal detection methods.

10. The method of claim 1, wherein the trench or channel and said via hole contact comprises a diffusion barrier liner, which also aids adhesion, liner type materials are selected from the group consisting of Ti, TiN, W, and TaN.

11. The method of claim 1, wherein the conducting material layers for conducting interconnect lines and said via contacts are selected from the group consisting of the following conducting type materials: Al, Cu, and AlCuSi.

12. The method of claim 1, wherein multilevel conducting structures are fabricating by repeating the integrated process described herein.

13. The method of claim 1, wherein each level of conducting structure is planarized by removing excess conducting material, including planarization by chemical mechanical polish (CMP) or etching.

14. The method of claim 1, wherein the special interconnect conducting lines/via contact structures and special interconnect structures with low parasitic capacitance are made by using a self aligned dual damascene process with special patterning comprising of two etch stop barrier layers, two intermetal dielectric layers, two patterning steps and three selective etch steps.

15. The method of claim 1, wherein unique conducting interconnect lines/via and interconnect structures are produced by this process, comprising a product with superior lines and via contact structures (by special patterning), hence improving reliability.

16. A method of fabricating an integrated circuit on a substrate, using a self aligned dual damascene process to form special conducting interconnect lines/via and interconnect structures are produced by this process, the method comprising the following steps:

providing a substrate or substrate module with integrated circuits therein;

providing a substrate having a layer of dielectric, inter-level dielectric (ILD), or an interconnect line layer, or device contact region to P-N junctions;

providing a first level of conducting wiring being defined and embedded in a first layer of insulator;

depositing (blanket) of a first etch stop barrier over said insulator and conducting wiring;

depositing (blanket) of the first intermetal dielectric layer (IMD) over first etch stop barrier;

depositing (blanket) of a second etch stop barrier over said first intermetal dielectric layer (IMD);

patterning and etching said second etch stop barrier by a partial removal of the second etch stop barrier over via and leaving the second etch stop barrier in place for subsequent trench or channel (interconnect) structures;

depositing (blanket) of a second intermetal dielectric layer (IMD) over the patterned etch barrier;

patterning and etching forming special self aligned interconnect/via structures and interconnect structures;

etching selectively to remove remnant etch stops;

depositing trench or channel and via barrier liner material, in addition to conducting material, and polishing back by chemical mechanical polishing (CMP) the excess conducting material layer;

repeating all of the above process steps to construct multilevel conducting interconnect and via structures;

thus by a method of self aligned damascene process, special multilevel interconnect/via and interconnect structures are fabricated, with low parasitic capacitance.

17. The method of claim 16, wherein said substrate is semiconductor single crystal silicon.

18. The method of claim 16, wherein said layers of etch stop barriers are low dielectric films, comprising of refractory materials selected from the group consisting of silicon nitride and silicon oxynitride with very different etch properties than silicon oxide for selective etching and act as etch stop barriers.

19. The method of claim 16, wherein special self aligned patterning and etch of the subsequent interconnect/via hole and interconnect (trench/channel) is performed which produces well-defined, special low parasitic capacitance structures (with low RC time constants).

20. The method of claim 16, wherein highly selective etch steps are performed using both the large etch differences between silicon oxide and silicon nitride and the specially patterned structures of the double level etch barrier stop layers.

21. The method of claim 16, wherein the combination interconnect/via structure and interconnect structures are unique, special, self aligned, with low parasitic capacitance, formed by special patterning and selective etch steps.

22. The method of claim 16, wherein both interconnect/via structures and interconnect structures are robustly fabricated with small, remnant low dielectric (etch stop barrier material) edge features at base of said structures which allow for low parasitic capacitance (low RC time constant) and the first etch stop barrier materials are selected from the group consisting of $Si_xN_y$ and SiON combined, and $Si_xN_y$; and the second etch stop barrier materials and selected from the group consisting of TaN, and TiN.

23. The method of claim 16, wherein the highly selective patterned etches comprise the following etch stop layers: first etch stop layer plasmas enhanced chemical vapor deposited from about 100 to 1,000 Angstroms thick of silicon nitride and/or silicon oxynitride, second etch stop layer reactive sputter deposited from about 30 to 500 Angstroms thick of TaN and/or TiN with intermetal dielectric layers of silicon oxide plasma enhanced CVD with 1,000 to 20,000 Angstroms thick.

24. The method of claim 16, wherein the highly selective patterned etches comprise critical process controls for all etch steps, with the use of fine tuning the etch selectivity and the use of endpoint signal detection methods.

25. The method of claim 16, wherein the trench or channel and said via hole contact comprises a diffusion barrier liner, which also aids adhesion, liner type materials are selected from the group consisting of Ti, TiN, W, and TaN.

26. The method of claim 16, wherein the conducting material layers for conducting interconnect lines and said via contacts are selected from the group consisting of the following conducting type materials: Al, Cu, and AlCuSi.

27. The method of claim 16, wherein multilevel conducting structures are fabricating by repeating the integrated process described herein.

28. The method of claim 16, wherein each level of conducting structure is planarized by removing excess conducting material, include planarization by chemical mechanical polish (CMP) or etching.

29. The method of claim 16, wherein the special interconnect conducting lines/via contact structures and special interconnect structures with low parasitic capacitance are made by using a self aligned dual damascene process with special patterning comprising of two etch stop barrier layers, two intermetal dielectric layers, two patterning steps and three selective etch steps.

30. The method of claim 16, wherein unique conducting interconnect lines/via and interconnect structures are produced by this self aligned process, comprising a product with superior lines and via contact structures (by special patterning), hence improving reliability.

31. The method of claim 16, wherein said alternating layers of low dielectric films, comprise refractory materials with very different etch properties for selective etch, etch stops, and can be alternating layers of silicon oxide and silicon nitride with varying thickness.

32. A method of fabricating an integrated circuit on a substrate, using a self aligned dual damascene process to form special conducting interconnect lines/via and interconnect structures are produced by this process, the method comprising the following steps:

providing a substrate or substrate module with integrated circuits therein;

providing a substrate having a layer of dielectric, interlevel dielectric (ILD), silicon oxide, or an interconnect conducting metal line wiring, or semiconductor device contact region to P-N junctions;

providing a first level of conducting metal wiring being defined and embedded in a first layer of insulator, silicon oxide;

depositing (blanket) of a first etch stop barrier over said insulator, silicon nitride/silicon oxynitride and conducting copper wiring;

depositing (blanket) of the first intermetal dielectric layer (IMS), silicon oxide, over first etch stop barrier;

depositing (blanket) of a second etch stop barrier, silicon nitride, over said first intermetal dielectric layer (IMD);

patterning with photo resist and reactive ion etching (RIE) said second etch stop barrier by a partial removal of the second etch stop barrier over via and leaving the second etch stop barrier in place for subsequent trench or channel structures;

patterning and etching said second etch stop barrier by depositing (blanket) of a second intermetal dielectric layer (IMD), silicon oxide, over the patterned etch barrier;

patterning with photo resist and reactive ion etching (RIE) forming special self aligned interconnect/via structures and interconnect structures;

etching by reactive ion etching (RIE) selectively to remove remnant etch stops;

depositing trench or channel and via barrier liner material selected from the group consisting of Ti, TiN, W and TaN, in addition to conducting copper, and polishing back by chemical mechanical polishing (CMP) the excess conducting copper layer;

repeating all of the above process steps to construct multilevel conducting interconnect and via structures;

thus by a method of self aligned damascene process, special multilevel interconnect/via and interconnect structures are fabricated, with low parasitic capacitance.

33. The method of claim 32, wherein said substrate is semiconductor single crystal silicon or is a ceramic module, with integrated circuits therein.

34. The method of claim 32, wherein said layers of etch stop barriers are low dielectric films, comprising of refractory materials selected from the group consisting of silicon nitride and silicon oxynitride with very different etch properties, than silicon oxide for selective etching and act as etch stop barriers.

35. The method of claim 32, wherein said layers of etch stop barriers are semiconductors, intermetallics or metals, comprising of materials with very different etch properties, than silicon oxide for selective etching and act as etch stop barriers.

36. The method of claim 32, wherein special half aligned patterning and etch of the subsequent interconnect/via hole and interconnect (trench/channel) is performed which produces well-defined, special low parasitic capacitance structures (with low RC time constants).

37. The method of claim 32, wherein highly selective etch steps are performed using both the large etch differences between silicon oxide and silicon nitride and the specially patterned structures of the double level etch barrier stop layers.

38. The method of claim 32, wherein the combination interconnect/via structure and interconnect structures are unique, special, self aligned, with low parasitic capacitance, formed by special patterning and selective etch steps.

39. The method of claim 32, wherein both interconnect/via structures and interconnect structures are robustly fabricated with small, remnant low dielectric (etch stop barrier material) edge features at base of said structures which allow for low parasitic capacitance (low RC time constant) and the first etch stop barrier materials are selected from the group consisting of $Si_xN_y$ and SiON combined, and $Si_xN_y$; and the second etch stop barrier materials are selected from the group consisting of TaN, and TiN.

40. The method of claim 32, wherein the highly selective patterned etches comprise the following etch stop layers: first etch stop layer plasmas enhanced chemical vapor deposited from about 100 to 1,000 Angstroms thick of silicon nitride and/or silicon oxynitride, second etch stop layer reactive sputter deposited from about 30 to 500 Angstroms thick of TaN and/or TiN with intermetal dielectric layers of silicon oxide plasma enhanced CVD with 1,000 to 20,000 Angstroms thick.

41. The method of claim 32, wherein the highly selective patterned etches comprise critical process controls for all etch steps, with the use of fine tuning the etch selectivity and the use of endpoint signal detection methods.

42. The method of claim 32, wherein the trench or channel and said via hole contact comprises a diffusion barrier liner, which also aids adhesion, liner type materials are selected from the group consisting of Ti, TiN, W, and TaN.

43. The method of claim 32, wherein the conducting material layers for conducting interconnect lines and said via contacts are selected from the group consisting of the following conducting type materials: Al, Cu, and AlCuSi.

44. The method of claim 32, wherein multilevel conducting structures are fabricating by repeating the integrated process described herein.

* * * * *